United States Patent [19]

Lin

[11] 3,883,372

[45] May 13, 1975

[54] METHOD OF MAKING A PLANAR GRADED CHANNEL MOS TRANSISTOR

[75] Inventor: Hung Chang Lin, Silver Spring, Md.

[73] Assignee: Westinghouse Electric Corporation, Pittsburgh, Pa.

[22] Filed: July 11, 1973

[21] Appl. No.: 378,291

[52] U.S. Cl. .................. 148/187; 148/188; 357/23; 357/54; 357/59

[51] Int. Cl. ................................................ H01i 7/44

[58] Field of Search ........ 148/187, 188; 357/23, 24, 357/54, 59

[56] References Cited

UNITED STATES PATENTS

| | | | |
|---|---|---|---|
| 3,363,760 | 1/1968 | Klein | 148/187 |
| 3,749,610 | 7/1973 | Swann et al. | 148/187 |
| 3,759,761 | 9/1973 | Mori et al. | 148/187 |
| 3,761,327 | 9/1973 | Harlow et al. | 148/187 |
| 3,775,191 | 11/1973 | McQuhae | 148/187 |

OTHER PUBLICATIONS

Cauge, T. et al., Double-Diffused MOS Transistor, in Electronics, 44, Feb. 15, 1971, pp. 99–104, (TK7800E58).

*Primary Examiner*—Walter R. Satterfield
*Attorney, Agent, or Firm*—D. Schron

[57] ABSTRACT

The method of fabrication of a planar narrow channel metal oxide semiconductor field effect transistor (MOSFET) by a double diffusion through a self-aligned silicon gate wherein a first type dopant is diffused into the same self-aligned window of the source diffusion already diffused with a second type dopant. The diffused source and drains are self-aligned by means of the silicon gate, thus permitting narrow gate lengths. The diffusion profile is such that the impurity concentration near the source is higher than that near the drain. When a reverse bias is applied between, for example, an n-type drain and a p-type diffused region, the depletion layer cannot widen as much toward the source as a uniform channel because of the impurity concentration profile. Thus a narrow channel length can be used withoout drain-source punch-through at low voltages. Meanwhile, the self-aligned silicon gate permits a close spacing between the source and drain contacts, thus reducing the feedback capacitance between the drain and the gate.

3 Claims, 8 Drawing Figures

METHOD OF MAKING A PLANAR GRADED CHANNEL MOS TRANSISTOR

BACKGROUND OF THE INVENTION

1. Field of the Invention

The present invention relates to semiconductor devices and their method of manufacture and more particularly to improved field effect transistors.

2. Description of the Prior Art

In conventional metal oxide semiconductor field effect transistors, hereinafter referred to as MOSFET's, the cut-off frequency is generally less than that of a bipolar transistor. The major reason for the lower cut-off frequency is that the channel length of the MOSFET cannot be made as narrow as the base of a bi-polar transistor. If the channel length were made narrow, say in the low micron range, the low drain-to-source punch-through voltage due to the depletion layer, would often render the MOSFET useless.

What is needed is a planar narrow channel MOSFET. Such a device was disclosed in a publication by T. P. Cauge, et al., entitled "Double-Diffused MOS Transistor Achieves Microwave Gain", appearing in Electronics, February 15, 1971, pages 99–104, inclusive. This publication also disclosed the self-alignment feature achieved by means of silicon gates. One method of manufacturing double diffused MOSFETs is disclosed in U.S. Pat. No. 3,690,966, issued to Y. Hayashi, et al.

SUMMARY

Briefly, the subject invention is directed to the fabrication process for obtaining a narrow channel planar MOSFET by a double diffusion in the source region through a self-aligned window adjacent a silicon gate which permits planar contacts to all of the electrodes. The substrate is first deposited with a layer of silicon dioxide followed by a layer of polycrystalline silicon and then by a layer of glass. In a first masking step, windows for the outlines of the source and drain are opened through the glass and polysilicon layers. In a second masking step, the mask for the source window is made slightly larger than the window provided by the first mask, to insure alignment of the double diffusions of the source. With the source window thus open to the surface of the substrate, a first type dopant is diffused into the substrate. After the drive in diffusion, the remaining glass is removed from the top of the polycrystalline silicon as well as the silicon-dioxide covering the drain region and a second type dopant is diffused into the source and drain regions. Next the polycrystalline silicon layer is selectively etched to isolate the gate and another layer of glass is again grown over the remaining surface of the structure and contact windows are opened therein. Finally, an aluminum fabrication and sintering process followed by a final masking step is applied to delineate the required electrical interconnection.

DESCRIPTION OF THE INVENTION

Figures 1, 2, 3A, 3B, 3C, 3D, 3E, 3F:
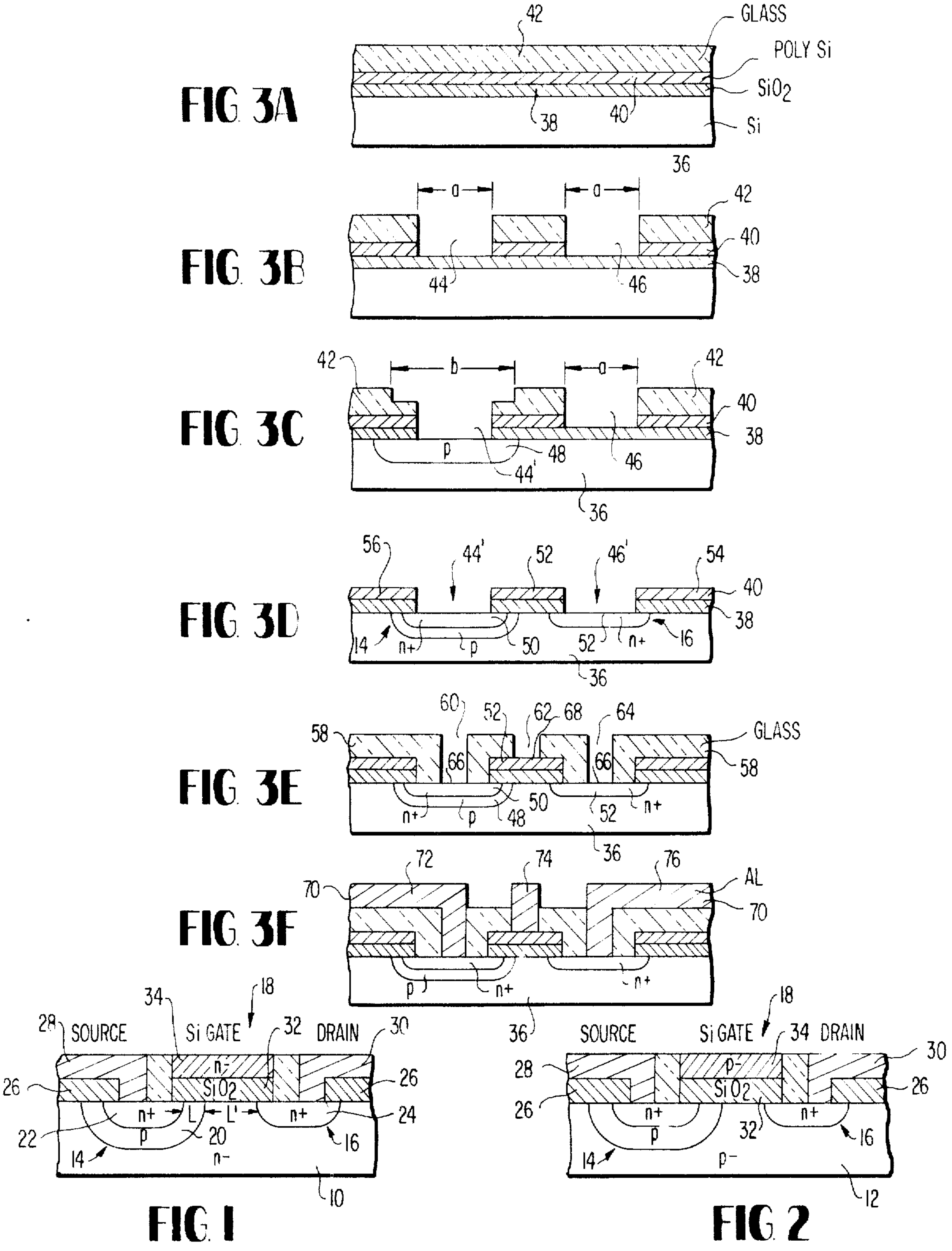
FIG. 1 is a fragmentary cross-sectional view of a depletion mode device having a double diffusion source region and a silicon gate.
FIG. 2 is a fragmentary cross-sectional view of an enhancement mode device having a double diffused source region and a silicon gate.
FIGS. 3A–3F are fragmentary cross-sectional views illustrative of the method of fabrication contemplated by the subject invention.

The principle of the subject invention is to obtain a narrow channel MOSFET by double diffusion through a self-aligned silicon gate which permits the planar top contacts to be made to all of the electrodes respectively connected to the source, gate and drain of the device. The basic structure is shown in FIGS. 1 and 2. The major difference between the structures shown and conventional devices is that the *p* type *n*+is diffused into the same self-aligned window as the n+ type source diffusion. The diffused source and drain are further self-aligned by means of the silicon gate, thus permitting a relatively narrower gate length. The channel is formed in the lateral diffused *p* region along the surface of the silicon. For a diffused profile, the impurity concentration near the source is higher than near the drain. Thus when a reverse bias is applied between the *n*+ type drain and the *p* type diffused region, the depletion layer cannot widen as much toward the source as in a uniform channel because of the impurity concentration profile. As such, a narrow channel length can be used without drain-source punch-through at low voltages. Additionally, the self-aligned silicon gate permits a close spacing between source and drain contacts, thus reducing the feedback capacitance between the drain and the gate.

Referring now more particularly to FIGS. 1 and 2 which respectively disclose depletion mode and enhancement mode devices, the structure of FIG. 1 requires an *n*− type substrate 10, whereas the structure shown in FIG. 2 requires a *p*− type substrate 12. Both structures include a double diffused source region 14, a drain region 16, and a gate region 18. The source region is comprised of a first diffusion of *p* type impurities in the region 20 followed by a second diffusion of *n*+ impurities in region 22. The drain region comprises a single diffusion of *n*+ impurities at the region 24 and is similar to the *n*+ source diffusion region 22. A silicon dioxide $SiO_2$ layer 26 is fabricated on the surface of the substrates 10 or 12 and suitable openings and metallization is fabricated therein to provide source and drain metal electrodes 28 and 30. A portion 32 of the silicon dioxide layer extends to and when desirable, may slightly overlap the diffused regions 20, 22 and 24. Over the silicon dioxide portion 32 is formed polysilicon material, in an aligned pattern therewith, thereby providing a silicon gate for the field effect transistor. Whereas in conventional MOS devices the region between the source and drain forms practically the entire channel length, the double diffusion type of device provides an effective channel length L shown in FIG. 1, which is the width of the *p* type diffusion region 20, together with a relatively long drift region L′ extending from the boundary of the *p* type diffusion region 20 to the *n*+ diffusion drain region 24. The *p* type region 20 can have a length L in the order of 1 micrometer. At the same time, the *p* type doping is more concentrated toward the source, thus reducing the punch-through effect.

The choice whether the device is either a depletion mode or an enhancement mode device is a matter of choice of the *p* type diffused layer concentration and substrate crystal orientation. The depletion mode device shown in FIG. 1, requires a low concentration *p* background and a high surface state density, i.e. <1,1,1> oriented crystals. The enhancement mode device such as shown in FIG. 2, on the other hand, requires a moderate *p* concentration background and a low surface state density. A surface concentration on the order of $1 \times 10^{16}$ atoms/cm$^3$ on a low surface state <1,0,0> oriented crystal is appropriate for the enhancement mode device. Alternatively, a high *p* type surface concentration in the low $1 \times 10^{17}$ atoms/cm$^3$ range and a high surface state density <1,1,1> crystal orientation can also be made for the enhancement mode device.

While the basic structures have been thus far considered, attention is now directed to FIGS. 3A–3F, which is illustrative of the fabrication process contemplated by the subject invention for such devices. Referring now to FIG. 3A, a substrate 36 of either *p*- or *n*-type silicon is first deposited with a thin layer 38 of silicon dioxide ($SiO_2$) the layer being in the order of $1 \times 10^3$A thick. Following the deposition of the oxide layer 38, a layer of polycrystalline silicon 40 is formed having a thickness in the order of $5 \times 10^3$A, followed by a layer 42 of glass having a thickness in the order of $10 \times 10^3$A.

With the three layers 38, 40 and 42, thus deposited on the substrate 36, a masking and etching step next takes place wherein the windows 44 and 46 both having a dimension *a* outlining the respective source and drain regions are opened through the glass layer 42 and the polysilicon layer 40. A second masking and etching step next takes place as shown in FIG. 3C wherein the window 44' for the source is opened through the oxide layer 40 only. The mask for window 44' is made slightly larger than the mask for window 44 having a dimension *b*, to insure alignment of the double diffusions of the source. During the photoetching required to open the window 44', the glass layer 42 is etched as shown but is thick enough so that no part of the glass is etched completely through to expose the polycrystalline layer 40.

With the source window 44' thus opened, a first type impurity dopant, e.g. *p* type impurities selected from the group consisting of boron, aluminum, gallium and indium, is diffused into the substrate 36 providing the *p* region 48 of a double diffusion. After the drive-in diffusion of the region 48, the remainder of the glass layer 42 remaining after the first two masking and etching processes is removed, as well as the silicon dioxide exposed in the window 46' as shown in FIG. 3D. Next a second type impurity dopant, e.g. *n*+ impurities, selected from the group consisting of phosphorous, arsenic, antimony and bismuth, is diffused into the substrate 36 through the windows 44' and 46', resulting in the *n*+ regions 50 and 52. The *p* region 48 and the *n*+ region 50 define a double diffused source region 14 while the region 52 defines a single diffused drain region 16.

Following the drive-in diffusions of the *n*+ type impurities into the source and drain regions 14 and 16, the polysilicon layer 40 is selectively etched to isolate a silicon gate 52, leaving the rest of the polycrystalline silicon layer 40 to serve as electrostatic boundary shields 54 and 56. If on the other hand the gate 52 is ring-shaped, the polycrystalline silicon etching step may be eliminated when desirable. Referring next to FIG. 3E, a second layer of glass 58 is grown over the structure shown in FIG. 3D and another masking and etching step is effected wherein the contact windows 60, 62 and 64 are opened, exposing the source and drain regions at the surface 66 of the substrate 36 as well as the surface 68 of the silicon gate 52. Finally, an aluminum evaporation and sintering step is performed which results in a layer 70 of electrode metallization followed by a last masking and etching step for delineating the drain electrode 72, the gate electrode 74, and the drain electrode 76.

When desirable, the diffusion steps may be modified. For example, if a slow *n*+ diffusant such as arsenic is used instead of phosphorous, then the sequence of the *p* type diffusion and the *n*+ type diffusion may be reversed.

The device thus fabricated according to the steps set forth above is graded in resistivity to prevent punch-through and has a very narrow channel length which inherently increases the frequency response. The contacts, moreover, are all on top of the structure resulting in a planar integrated circuit structure. As noted above, the double diffused MOSFET transistor can be fabricated on either a p-type substrate or an n-type substrate. A p-type substrate is self isolating and is therefore desirable for integrated circuits. On the other hand, the *n*-type substrate has the same conductivity type as the channel and can therefore increase the conductivity of the channel near the drain. Double diffused MOSFET transistors having silicon gates fabricated according to the present invention not only result in higher speed, but also smaller chip area for integrated circuit structures, and also require a lower supply voltage, thus resulting in decreased power dissipation.

I claim:

1. A method of making a planar metal oxide semiconductor field effect device having a relatively narrow channel region and a silicon gate, wherein the improvement comprises:

forming a relatively thin insulating layer of oxide approximately $1 \times 10^3$A thick over a semiconductor substrate of selected conductivity type;

forming a layer approximately $5 \times 10^3$A thick of polycrystalline silicon over said insulating layer;

forming a first layer of glass over said polycrystalline silicon layer to a thickness approximately $10 \times 10^3$A thereby being substantially greater than the thickness of the insulating layer;

masking and etching through said glass and polysilicon layers to the surface of said silicon layer to form at least two spaced apart windows of predetermined area for source and drain regions, respectively;

masking an area greater than said predetermined area over said first glass layer at the location of and substantially aligned with at least one window of said at least two windows corresponding to said source region for insuring proper alignment of a subsequent double diffusion thereat and then etching the glass at said larger area and the insulating layer to the surface of said substrate at the location of said at least one window, said thickness of said first glass layer thereby preventing any etching of the polysilicon layer thereat;

diffusing a first conductivity type impurity dopant selected from the group consisting of boron, aluminum, gallium and indium through said at least one window into the surface of said substrate;

removing the remainder of said first glass layer and any remaining insulating layer at the location of the other window;

simultaneously diffusing a second conductivity type impurity dopant selected from the group consisting of phosphorous, arsenic, antimony and bismuth through said at least two windows into the surface of said substrate to produce a double diffused source region and a single diffused drain region;

the intermediate portion of said insulating layer and said polycrystalline layer thereby producing a silicon gate while the polycrystalline layer extending beyond said at least two windows serves as an electrostatic shield;

forming a second layer of glass over the surface of the polycrystalline silicon and the surface of said substrate exposed by said at least two windows;

etching contact windows through said second layer of glass to the surface of said substrate at the source and drain regions and the surface of the silicon gate; and forming a layer of metallization therethrough and etching a selected pattern for forming discrete metal electrodes.

2. The method as defined by claim 1 wherein the substrate is silicon having *n*-type conductivity.

3. The method as defined by claim 1 wherein said semiconductor substrate is silicon having *p*-type conductivity.

* * * * *